United States Patent [19]
Carlsen, II et al.

[11] 4,287,477
[45] Sep. 1, 1981

[54] FEEDBACK ARRANGEMENT

[75] Inventors: George C. Carlsen, II, Redondo Beach; John C. Crumm, Pacific Palisades, both of Calif.; Koji Matsuda, Kyoto, Japan

[73] Assignee: Dynamic Compliance, Incorporated, Santa Monica, Calif.

[21] Appl. No.: 13,815

[22] Filed: Feb. 22, 1979

[51] Int. Cl.³ .......................... H03F 1/34; H03F 3/26
[52] U.S. Cl. ............................. 330/255; 330/260; 330/265; 330/293
[58] Field of Search ............... 330/105, 108, 255, 260, 330/265, 293, 276, 271; 178/1 F, 1 A

[56] References Cited

U.S. PATENT DOCUMENTS 2,740,850  4/1956  Massaut ..................... 179/1 F X

FOREIGN PATENT DOCUMENTS 840666   7/1960  Fed. Rep. of Germany ........ 330/293
1589840  6/1970  Fed. Rep. of Germany ........ 330/271

*Primary Examiner*—James B. Mullins
*Attorney, Agent, or Firm*—Kenneth W. Float

[57] ABSTRACT

An arrangement to provide feedback to amplifier systems incorporating an inductive laod. A low value error-sensing resistor is incorporated in conjunction with one or more transistors to provide a feedback correction signal to an amplifier which corrects for distortion caused by both the amplifier and the inductive load. A first embodiment providing a single-ended amplifier system incorporates an error-sensing resistor in series with a transistor, an inductive load and a bias resistor. A negative feedback error signal is provided to the amplifier from a point between the error-sensing resistor and the bias resistor. A second embodiment additionally includes a transformer to isolate the load. The third embodiment provides push-pull amplifier configurations. The third embodiment incorporates two complementary transistors to drive an inductive load. A pick-off arrangement including two capacitors and an error-sensing resistor provides negative feedback to the amplifier.

3 Claims, 3 Drawing Figures

Fig. 1.
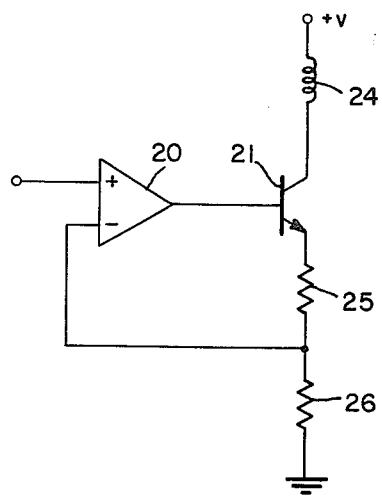
Fig. 2.
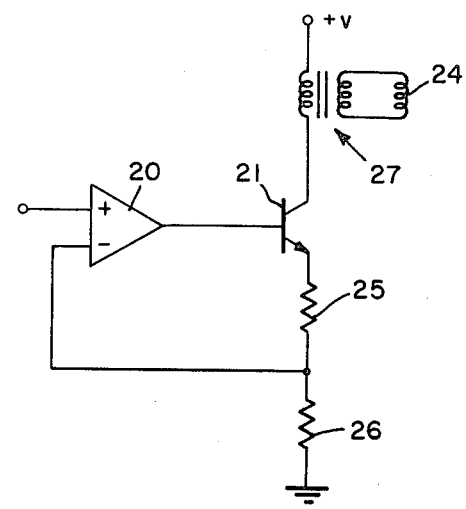
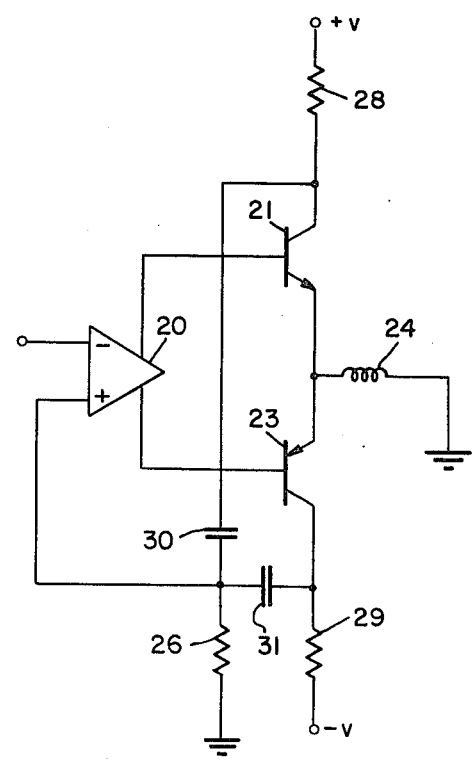
Fig. 3

FEEDBACK ARRANGEMENT

BACKGROUND OF THE INVENTION

The present invention relates generally to amplifier systems, and more particularly to a feedback arrangement for correcting distortion in an amplifier system.

Generally, audio amplifiers, or the like, are designed to amplify an input signal and apply it to a load with a minimum amount of distortion. In systems using inductive loads, a back EMF or voltage is generated by the load which is proportional to the inductance of the load times the rate of change of the current through the load. Heretofore, conventional amplifiers used to drive inductive loads have been unable to do so without introducing distortion into the output signal. This distortion is due to the time varying back EMF change which either boosts or reduces the output signal, thus introducing distortion.

One prior attempt to correct for distortion in inductive loads utilizes a fixed filter arrangement to provide a predistorted signal to the load. If the distortion characteristics of the load are known, the predistorted signal is shaped so as to interact with the load to produce an undistorted signal in a manner analogous to the concept of destructive interference.

However, this approach produces acceptable results only over a limited frequency range. The approach is unacceptable when used with devices such as shaker table drivers, magneto-strictive devices, and loudspeakers, or the like, which operate over wide frequency and harmonic ranges, and which are subject to varying loads over their operating ranges. Also, distortion in recording systems such as magnetic tape phonograph discs, or the like, may not be corrected by prior art systems.

For example, many prior art systems have attempted to correct for distortion in amplifier systems incorporating loudspeakers. Many factors affect the distortion-free performance of the loudspeaker including speaker cone mass, air resistance, and self-resonances. Nonlinearities introduced by these speaker properties result in changes in the back EMF of the speaker which boosts or reduces the amplifier output signal, producing unwanted distortion.

Prior attempts to correct for distortion include various types of sensors in the speaker to detect speaker motion. Typical of these sensors are light beam systems, extra voice coils, and tapped voice coils. The sensors generate error signals by comparing signals proportional to the speaker motion and the amplifier input signal, and applying the error signals to the amplifier in a feedback arrangement.

Typical of prior art systems utilizing feedback are U.S. Pat. No. 2,358,630, issued Sept. 19, 1944, for "Amplifier System"; U.S. Pat. No. 3,656,831, issued Apr. 18, 1972, for "Feedback Amplifier"; and French Pat. No. No. 7509775, issued Oct. 29, 1976 for "Loudspeaker Feedback Circuit."

The French patent is considered the most relevant prior art. This patent discloses a differential power amplifier driving a loudspeaker in series with a load resistor. Negative feedback is applied to the amplifier from a point between the loudspeaker and the load resistor. This patent also discloses using an RC filter arrangement as part of the feedback loop.

The arrangement disclosed in the French patent, however, may not provide distortion-free performance over the full speaker frequency range. Error signals produced by this arrangement are affected by possible resonances between the error signal-sensing circuit and the inductive load, since the circuit is connected directly to the load. Also, the strength of the error signal as fed back to the amplifier is generally not sufficient in strength to completely cancel the speaker distortion.

In addition, many of the prior art systems include many components, which adds to system complexity, cost and reduced reliability. None of the prior art systems mentioned hereinabove includes short circuit protection for the amplifier. Those systems incorporating sensors in the speakers introduce their own nonlinearities into the system, resulting in error signals which do not faithfully represent the speaker motion.

OBJECTS OF THE INVENTION

Accordingly, it is an object of the present invention to provide a feedback arrangement which corrects for distortion in amplifier systems driving inductive loads.

A further object of the present invention is to provide a feedback arrangement which includes short circuit protection.

SUMMARY OF THE INVENTION

In accordance with these and other objects of the present invention, there is provided a feedback arrangement for correcting distortion in an amplifier system driving an inductive load. The arrangement generally comprises a differential power amplifier, load and a feedback circuit including at least one transistor and a low value error-sensing resistor. The circuit provides both short circuit protection for the amplifier and error signals which correct for nonlinearities introduced by the amplifier or the inductive load.

Three specific embodiments are disclosed. Two single-ended versions and one push-pull version are disclosed.

The first embodiment comprises a differential amplifier coupled to the base of a power output transistor which has its collector coupled to an inductive load and hence to a voltage supply. The emitter of the transistor is coupled in series to an error-sensing resistor and emitter bias resistor and hence to the ground return of the voltage supply. Negative feedback is applied to the amplifier from a point between the error-sensing resistor and the bias resistor.

A second embodiment adds a transformer to additionally isolate the load from the amplifier and feedback circuit.

A third embodiment incorporates a differential amplifier having two complementary outputs coupled to the bases of two power output transistors. The emitters of the two transistors drive an inductive load. The collectors of the transistors are connected through individual resistors to positive and negative terminals of a voltage supply in an individual manner. A negative feedback arrangement incorporating two capacitors and an error-sensing resistor couples the respective collectors of the two transistors to the differential amplifier.

BRIEF DESCRIPTION OF THE DRAWINGS

The foregoing and other objects and features of the present invention may be more readily understood with reference to the following detailed description taken in conjunction with the accompanying drawings, wherein like reference numerals designate like structural elements, and in which:

FIGS. 1 and 2 are single-ended amplifier systems made in accordance with the present invention; and FIG. 3 is push-pull amplifier made in accordance with the present invention.

DETAILED DESCRIPTION

Referring to FIG. 1, there is shown a differential amplifier 20 having positive and negative input terminals and having an output terminal connected to the base of an output power transistor 21. The collector of the transistor 21 is connected to an inductive load 24 and hence to a positive terminal of a voltage supply.

The emitter of the transistor 21 is connected in series to an emitter bias resistor 25 and an error-sensing resistor 26 and hence to a ground return terminal of the voltage supply. The negative terminal of the amplifier 20 is connected to the junction between the error-sensing resistor 26 and the emitter bias resistor 25. The positive terminal of the amplifier 20 is adapted for receiving input signals.

In operation, output signals from the amplifier 20 are applied to the load 24 through the transistor 21. A composite signal from both the amplifier 20 and load 24 is sampled by the error-sensing resistor 26.

The voltage measured across the error-sensing resistor 26 contains all the error information needed to correct for distortions due to nonlinearities in the amplifier 20 or the load 24.

The voltage across the error-sensing resistor 26 is applied to the negative terminal of the amplifier 20 and summed with the input signal applied to the positive terminal of the amplifier 20. The combined signal is then amplified and applied to the load 24.

The output signal from the amplifier 20 has thus been modified with respect to the input signal in such a way as to exactly compensate for nonlinearities in both the amplifier 20 and load 24.

The value of the error-sensing resistor 26 is adjusted so that the voltage measured across the resistor 26 is equal to the input voltage applied to the positive terminal of the amplifier 20. This provides for 100 percent feedback with high open loop gain.

Typical of the value of the error-sensing resistor is 0.075 ohms which may be incorporated in a SONY model No. STR 6045 amplifier, or the like.

FIG. 2 shows an amplifier system similar to the amplifier system of FIG. 1, but additionally incorporates an impedance-matching transformer 27 having its primary connected between the collector of transistor 21 and the positive terminal of the voltage supply. The secondary winding of the transformer 27 is connected to the load 24. The general operation is substantially identical to the operation of the circuit of FIG. 1.

FIG. 3 shows a push-pull circuit made in accordance with the present invention. There is provided a differential amplifier 20 having positive and negative input terminals and two complementary output terminals. The output terminals are connected to bases of first and second output power transistors 21, 23.

The collector of the first transistor 21, which may be an NPN-type transistor, is connected to a first resistor 28 and hence to a positive terminal of a voltage supply. The collector of of the second transistor 23, which may be a PNP-type transistor, is connected through a second resistor 29 to a negative terminal of the voltage supply. The emitters of the first and second transistors 21, 23 are connected together and to one end of an inductive load 24. The other end of the load 24 is connected to a ground return terminal of the voltage supply.

A first capacitor 30 is connected from a point between the collector of the first transistor 21 and the first resistor 28 to one end of an error-sensing resistor 26. The other end of the error-sensing resistor 26 is connected to the ground return terminal of the voltage supply.

A second capacitor 31 is connected from a point between the collector of the second transistor 23 and the second resistor 29 to a point between the first capacitor 30 and the error-sensing resistor 26, and also to the positive terminal of the amplifier 20. The negative terminal of the amplifier 20 is adapted to receive input signals.

Thus, there has been provided circuits adapted to correct for distortions caused by amplifiers or inductive loads of an amplifier system. The circuits may be adapted for use with amplifiers which drive loudspeakers, magnetic deflection coils, solenoid actuators, DC and AC servo motors, electromagnetic transducers such as shaker table drivers or magneto-strictive devices, magnetic recording systems, phonograph disc recording systems, optical sound track recording, or laser hole-cutting systems.

It is to be understood that the above-described embodiments of the present invention are merely illustrative of the many specific embodiments which represent applications of the principles of the present invention. Numerous and varied other arrangements may be readily devised in accordance with these principles by those skilled in the art, without departing from the spirit and scope of the present invention.

What is claimed is:

1. A feedback arrangement for correcting distortion in an amplifier system, the distortion resulting from nonlinearities in the amplifier system and a load connected thereto, said feedback arrangement comprising:
    a differential amplifier having positive and negative input terminals, and having an output terminal,
    a power output transistor having a base, an emitter, and a collector, the base of said transistor being connected to the output terminal of said differential amplifier,
    an inductive load connected between the collector of said power output transistor and the positive terminal of a voltage supply,
    an emitter bias resistor having one end connected to the emitter of said transistor, and
    an error-sensing resistor having one end connected to the other end of said emitter bias resistor and having the other end connected to the negative terminal of said voltage supply,
    the negative terminal of said differential amplifier being connected to the junction between said error-sensing resistor and said emitter bias resistor,
    the value of said error-sensing resistor being chosen such that the voltage across said error-sensing resistor substantially equals the voltage applied to the positive terminal of said differential amplifier whereby an input signal applied to the positive terminal of said differential amplifier provides 100 percent negative feedback to said differential amplifier resulting in an error-correcting feedback signal which corrects nonlinearities introduced by said amplifier system and said load when processed by said amplifier system.

2. The feedback arrangement of claim 1 wherein said load comprises a transformer and an inductive load.

3. A feedback arrangement for correcting distortion in an amplifier system, the distortion resulting from nonlinearities in the amplifier system and a load connected thereto, said feedback arrangement comprising:

a differential amplifier having positive and negative input terminals and having first and second complementary output terminals;

a first power output transistor having a base, an emitter and a collector, the base of said first power output transistor being connected to the first complementary output terminal of said differential amplifier;

a first resistor having one end coupled to the collector of said first power output transistor and the other end connected to a positive terminal of a voltage supply;

a second power output transistor having a base, an emitter and a collector, the base of said first power output transistor being connected to the second complementary output of said differential amplifier;

a second resistor having one end coupled to the collector of said second power output transistor and the other end connected to a negative terminal of the voltage supply;

an inductive load having one end connected to both emitters of said first and second power output transistors, and having the other end connected to a ground return terminal of the voltage supply;

a first capacitor having one end connected to the junction between the collector of said first power output transistor and said first resistor;

an error-sensing resistor having one end connected to the other end of said first capacitor and having the other end connected to the ground return terminal of the voltage supply; and a second capacitor having one end connected to the junction between the collector of said second power output transistor and said second resistor and having the other end connected to the positive terminal of said differential amplifier and to the junction between said first capacitor and said error-sensing resistor;

the value of said error-sensing resistor being chosen such that the voltage across said error-sensing resistor substantially equals a voltage applied to the negative terminal of said amplifier;

whereby the input signal applied to the negative terminal of said differential amplifier provides 100 percent feedback to the positive terminal of said differential amplifier resulting in an error correction feedback signal which corrects for distortion introduced by said amplifier system and said load when processed by said amplifier system.

* * * * *